United States Patent [19]

Nei et al.

[11] Patent Number: 4,787,062
[45] Date of Patent: Nov. 22, 1988

[54] GLITCH DETECTION BY FORCING THE OUTPUT OF A SIMULATED LOGIC DEVICE TO AN UNDEFINED STATE

[75] Inventors: Chu C. Nei, San Jose; Dan R. Hafeman, Sunnyvale; William Fazakerly, Saratoga, all of Calif.

[73] Assignee: Ikos Systems, Inc., Sunnyvale, Calif.

[21] Appl. No.: 878,552

[22] Filed: Jun. 26, 1986

[51] Int. Cl.⁴ ............................................. G06F 11/28
[52] U.S. Cl. ....................................... 364/900; 371/23
[58] Field of Search ... 364/200 MS File, 900 MS File, 364/578, 141; 371/23

[56] References Cited

U.S. PATENT DOCUMENTS

| | | | |
|---|---|---|---|
| 3,909,802 | 9/1975 | Cassarino et al. | 364/200 |
| 3,969,722 | 7/1976 | Danco et al. | 364/200 |
| 4,063,308 | 12/1977 | Collins et al. | 364/200 |
| 4,306,286 | 12/1981 | Cocke et al. | 364/200 |
| 4,527,249 | 7/1985 | Brunt | 364/578 |
| 4,571,724 | 2/1986 | Belmondo et al. | 371/25 |
| 4,587,625 | 5/1986 | Marino et al. | 364/578 |
| 4,628,471 | 12/1986 | Schuler et al. | 364/578 |
| 4,656,580 | 4/1987 | Hitchcock | 364/200 |
| 4,675,832 | 6/1987 | Robinson et al. | 364/521 |

OTHER PUBLICATIONS

Szygenda, S., et al., "Implemental Techniques for Handling Spikes in an Assignable Delay Simulator", Proceedings of 1974 Winter Simulation Conference, Jan. 14–16, 1974, pp. 721–722.

Primary Examiner—Archie E. Williams, Jr.
Assistant Examiner—Ayni Mohamed
Attorney, Agent, or Firm—Walter J. Madden, Jr.; Alan H. MacPherson; Paul J. Winters

[57] ABSTRACT

Races and hazards in simulated logic designs are more easily detected if the logic simualtor is able to warn the designer of the presence of glitches. A glitch wall occur at the output of a logic device if an input condition causes the output to begin to change but the input condition is not present for sufficient time to allow the output to reach its stable state. The logic evaluator is the component of the logic simulator which is responsible for determining the output of a simulated device when the inputs to that device are known. The glitch detecting logic evaluator according to the present invention provides glitch detection by forcing the simulated device output to the undefined state when the device inputs change in a manner which does not allow the change to propagate to the output before a subsequent change occurs. The algorithms are designed for implementation in hardware for high performance logic simulation.

4 Claims, 4 Drawing Sheets

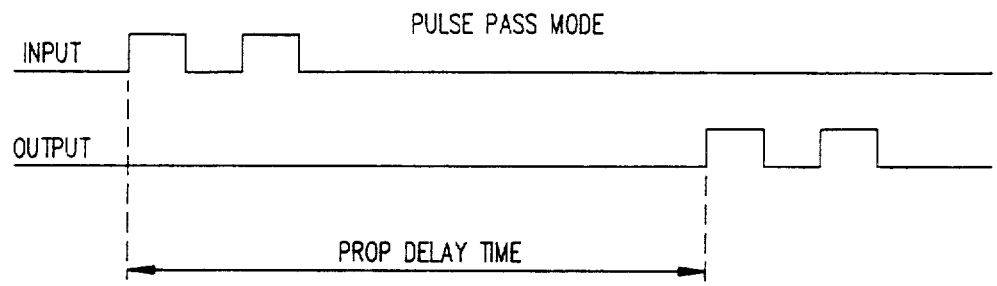

ALL PULSES ARE PASSED TO THE OUTPUT OF THE GATE EVEN THOUGH
THE PULSE DURATION IS LESS THAN THE PROP DELAY OF THE DEVICE

*FIG. 1A*

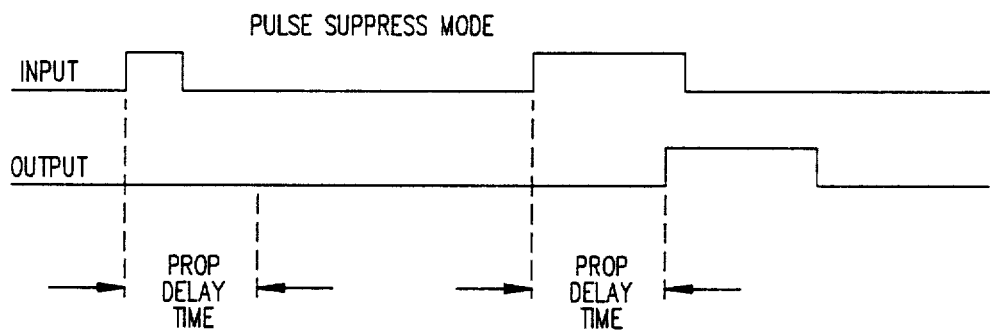

FIRST PULSE IS NOT PASSED TO OUTPUT OF THE GATE SINCE THE
PULSE DURATION IS LESS THAT THE PROP DELAY OF THE DEVICE

*FIG. 1B*

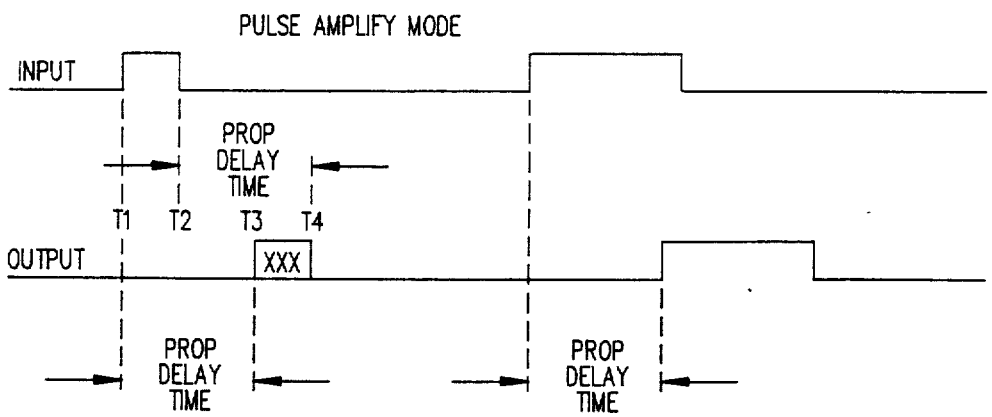

FIRST PULSE CAUSES OUTPUT OF THE GATE TO GO UNDEFINED SINCE
THE PULSE DURATION IS LESS THAT THE PROP DELAY OF THE DEVICE
DEVICE RISE AND FALL DELAYS ARE SHOWN EQUAL TO SIMPLIFY THE
DIAGRAM. TYPICAL RISE AND FALL DELAYS ARE NOT EQUAL.

*FIG. 1C*

GLITCH DETECTION BY FORCING THE OUTPUT OF A SIMULATED LOGIC DEVICE TO AN UNDEFINED STATE

CROSS-REFERENCE TO RELATED APPLICATIONS

1. Dual Mode Logic Simulation Accelerator, filed June 25, 1986, Ser. No. 878,459 and assigned to the same assignee as the present invention.

2. Stimulus Engine for a Logic Simulation System, filed June 25, 1986, Ser. No. 878,458 and assigned to the same assignee as the present invention.

BACKGROUND OF THE INVENTION

The present invention relates to a logic simulation system, and more particularly to a hardware logic simulation accelerator.

One of the most difficult problems associated with hardware logic simulation accelerators is the modeling of devices. In a software simulator, there is almost unlimited flexibility in determining device operation. In a hardware accelerator, the operation of the simulated device is constrained by the capabilities designed into the hardware of the evaluator.

Existing hardware accelerators allow devices to be modeled in either a "pulse pass" (delay line mode) or in a "pulse suppress" (filter mode). In the pulse pass mode, the rising and falling output delays must be equal. In the pulse suppress mode, the rising and falling delays may be different. However, there is a need for an additional delay mode.

There are two facts which lead to the need for an additional delay mode. These two facts are: (1) Most actual logic circuit processes result in different rising and falling delays (this is especially true for the CMOS process); (2) It is desirable to know that the inputs to a device changed in such a way as to cause an output change even if the duration of the input state was less than the device propagation delay. The pulse pass mode does not allow the different rising and falling delays to be modeled, and the pulse suppress mode hides the input changes which do not exist for a period of time sufficient to pass the pulse. A pulse amplify mode would allow the rising and falling propagation delays to differ without sacrificing the ability to detect input changes with duration less than the device propagation delays.

An additional benefit which is gained by supporting a pulse amplify mode is that parameter checking is simplified for complex cell design. For example, it is desirable in flip flop models to detect violations of setup time, hold time, clock pulse width, etc. This detection can be done by using pulse amplify mode in certain primitives within the flip flop cell.

SUMMARY OF THE INVENTION

It is an object of the present invention to provide for a glitch detecting logic evaluator.

The evaluator includes means for allowing event scheduling to be directly controlled in order to better utilize a pulse amplify capability in cell modeling. Other objects, features and advantages of the present invention will become apparent from the following detailed description when taken in conjunction with the accompanying drawings.

BRIEF DESCRIPTION OF THE DRAWINGS

FIGS. 1A, 1B and 1C depict timing diagrams which illustrate the pulse pass, pulse suppress and pulse amplify operation mode, respectively according to the present invention.

DETAILED DESCRIPTION OF THE DRAWINGS

Figure 2A:
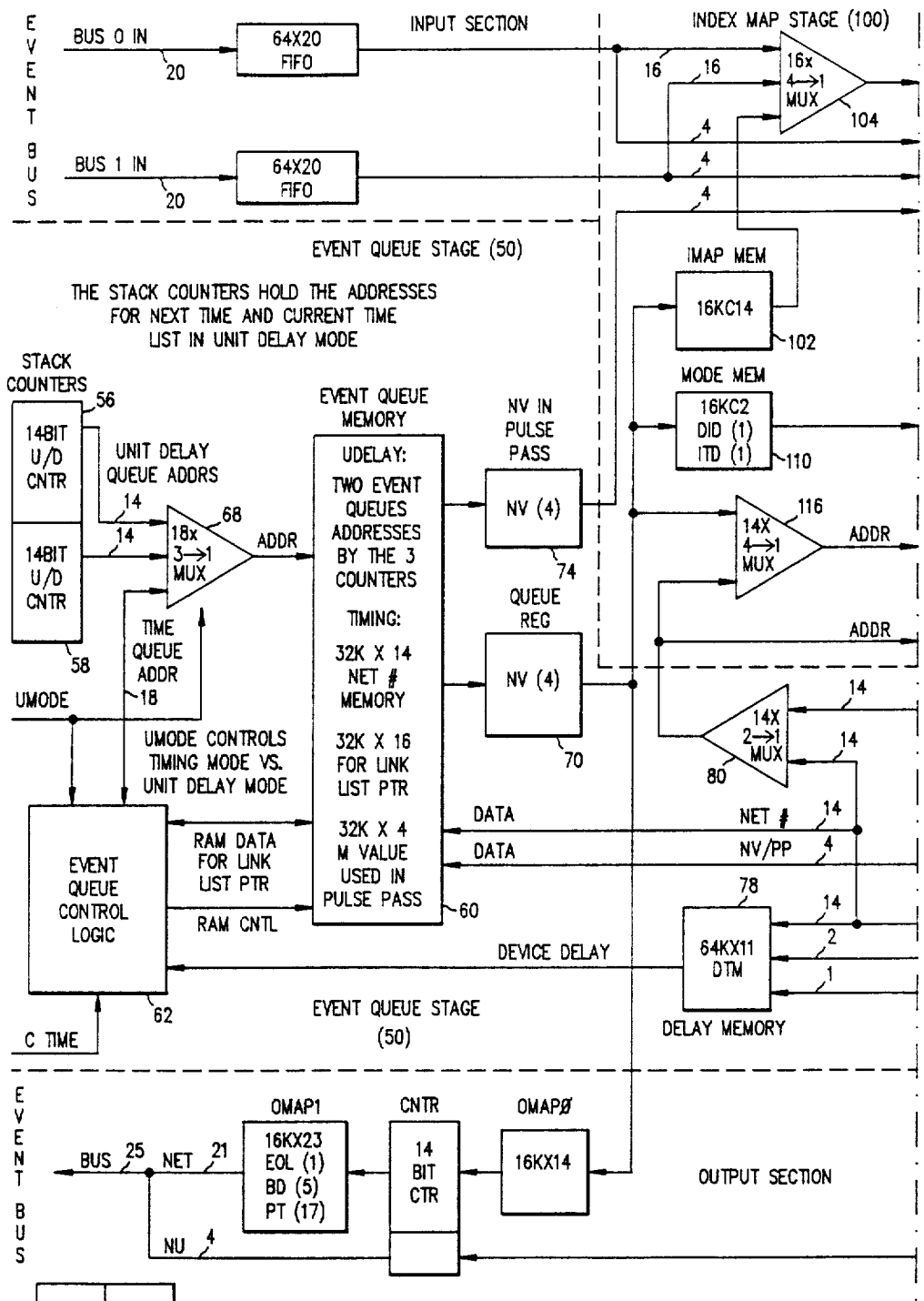
FIGS. 2A and 2B depicts a block diagram of an evaluator.

The present invention is related to the above identified patent applications entitled "Dual Mode Logic Simulation Accelerator" and "Stimulus Engine for a Logic Simulation System," the details of which are hereby incorporated by reference. The aspects of the present invention with respect to a glitch detecting logic evaluator will be described in conjunction with the accompanying FIGS. 1-3. Specifically, the aspects of pulse pass, pulse suppress and pulse amplify will now be described.

Event driven logic simulators, whether implemented in software or hardware, represent logic activity as a series of "events." These events consist of a net address, a time parameter, and a new logic state for the net. Every net (or node) has a driving device and a unique net address. The time parameter may be in absolute time or a time interval relative to a previous event. The logic state is typically made up of three or more values and three or more strengths. Typical values are logic zero, logic one and undefined. Typical strengths are driving, resistive, and high impedance. In the described embodiment, each evaluator primitive element can be modeled with up to 16 logic states, and the logic function of each primitive element is user definable. In the timing mode of operation, each primitive element supports up to four independent input-to-output delays. The detailed timing behavior of each primitive element can be modeled in one of three modes: pulse pass (rise time equal fall time), pulse suppress (glitches suppressed) or pulse amplify (glitches amplified and displayed).

TIME DOMAIN DESCRIPTION OF THE THREE MODES

Pulse pass operation is shown in FIG. 1A. In this mode of operation, all pulses are passed to the output of the gate even though the pulse duration is less than the propagation delay of the device. FIG. 1B illustrates operation in the pulse suppress mode. The first pulse has duration less than the device propagation delay, and as a result is not passed to the output. The second pulse has duration greater than the device propagation delay and is therefore passed to the output.

The timing diagram of FIG. 1C will be used to describe a preferred embodiment of pulse amplify operation. The first event occurs at t1 on the primitive input. The evaluation of the t1 event results in a change on the primitive output and the change is scheduled to occur at t1+prop delay=t3. The next event occurs at t2 on the primitive input and results in a change on the primitive output scheduled to occur at t2+prop delay=t4. The first scheduled event matures at t3. However, at t3 there is an event scheduled from the input change at t2. When an event matures while another event is still scheduled (i.e., in the event queue), the primitive output is set undefined. Later, at t4, the last event matures and the primitive output is set to the correct state.

It can be seen that the undefined pulse at the primitive output is a warning of a possible design problem. If, for instance, the output signal in FIG. 1C were connected to the clock input of a flip flop, it would be safer for the logic simulator to set the flip flop undefined than to assume that the input pulse would never cause a glitch at the output. When pulse amplify mode is selected, the logic simulator will not assume the short pulses are filtered by the logic gates.

The second pulse shown in FIG. 1C is of duration greater than the primitive propagation delay and is therefore passed to the primitive output. In this case, the output of the primitive is not set undefined since no event matures or is scheduled while another event is scheduled.

THE SIMULATION PROCESS

Various aspects of the simulation process have been described in the two cross-referenced patent applications identified above. The present invention focuses on the Evaluation Stage (250), the Event Queue Stage (50) and to a lesser extent on the Index Map Stage (100) shown in FIG. 2. See the cross-referenced patent application entitled "Dual Mode Logic Simulation Accelerator" for a description of the pipelined data flow and the operation of the other stages of the pipe.

EVALUATION

The basic logic building block in a hardware accelerator is called a "primitive." In a described embodiment, the primitive is a four input single output device. The logic state and the logic strength of the output is determined by the logic state and strength of the four inputs. The process of determining the future state and strength of the output is called "logic evaluation." In FIG. 2, the evaluation is performed in the Evaluation Stage (250) of the pipeline. The Evaluation Stage is in essence a large memory. The address of the memory is formed by the Opcode of the primitive and the Pin Values of the primitive input pins. The Opcode determines whether the memory Eval (260), the Strength Eval (256) or the Gate Eval (258) array is used. Stored in these memories is the correct output value based upon the values of the input pins. This correct value is compared with the LSV (last scheduled value) MEM to determine if an event is to be scheduled. The comparison logic is shown as (280). If the correct value is different than the LSU an event will be scheduled unless the schedule logic overrides. The schedule logic is controlled by NSCHD and SCHD from the SCH CNTL memory (270). This memory is addressed by the pin values, the opcode, and the number of the input pin which changed. The schedule control capability allows events to be scheduled even when the evaluation does not result in a new output value. It can also be used to prevent events from scheduling even when the evaluation results in a new output value.

The memories in the Evaluation Stage are written before the simulation is begun. The data contents are based upon the desired operation of the various devices in the logic circuit. In a sense, these memories are simply an expanded truth table for the devices in the logic circuit.

The six stages of the pipeline architecture according to the present invention will now be described in detail in conjunction with FIG. 2.

FIRST STAGE

The first stage of the pipeline is the Event Queue Stage 50 read cycle. At this point in the pipeline, the simulation clock has just advanced to the next simulation time interval and the event(s) which mature during this time interval are read from the Event Queue Memory 60. The net address (unique for each net driver) affected by the maturing event is stored in the Event Queue and is used to "look up" the net activity in the subsequent stages of the pipeline. The queue operation is controlled by the UMODE signal shown in FIG. 2. UMODE selects between the timing mode operation and the unit delay operation.

In unit delay mode, the address to the Event Queue Memory is contained in the Stack Counters 56 and 58. One counter contains the address of the current time interval list and the other contains the next time interval list. The events in the lists are stored in the Event Queue Memory 60 and the counter containing the current time interval list address is advanced when each event is removed from the list. The counters are switched when time advances.

In timing mode, the Event Queue Control Logic 62 generates the address for the Event Queue Memory 60. The first access after time advances is the access to the link list pointer array in the Event Queue Memory 60. The address into the pointer array is determined by the current time (CTIME) variable. The pointer array contains a pointer to the head and the tail of the linked list of events which mature in that time interval. When an event is removed from the queue, the head pointer is used and the memory space is added to the free list. When the list corresponding to the current time interval is exhausted, the simulation time advances to the next time interval.

The Queue Register 70 is the output of Event Queue Stage and holds the net number for the maturing event. (The NV portion of the Queue Register 74 also holds the next value (i.e., the next state and strength) of the net for evaluation of pulse pass devices.

SECOND STAGE

Figure 2B:
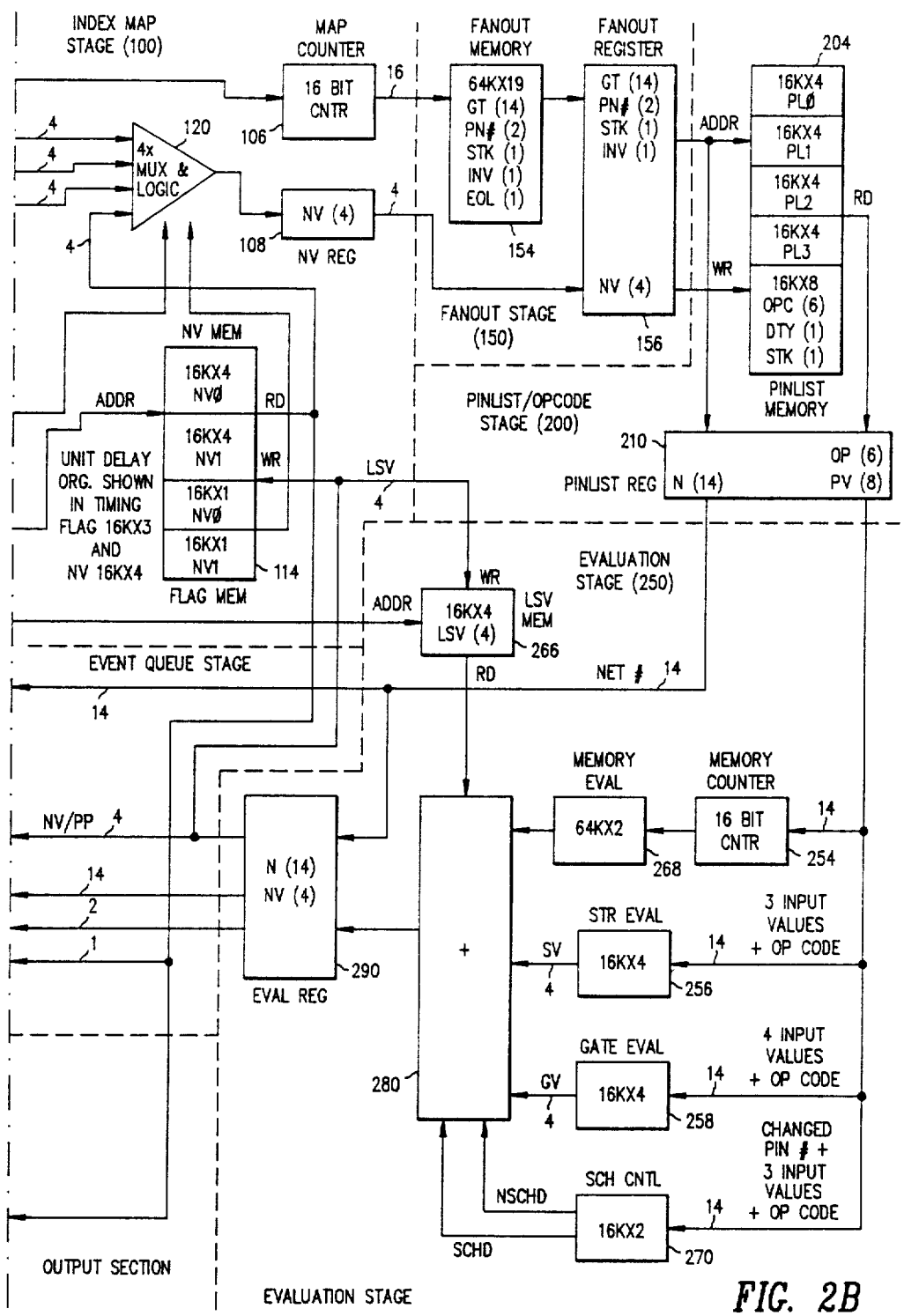

The second stage of the pipeline in FIG. 2 is the Index Map Stage 100. The net number from the Queue Register 70 forms an address into the IMAP Memory 102. IMAP Memory 102 contains the pointer into the Fanout Memory 154 of the Fanout Stage 150 to the base of the fanout list for the net. The fanout list is derived from the netlist of the logic circuit. The indexing scheme allows the number of fanout devices to vary from net to net. This pointer is loaded into the Map Counter 106.

The net number from the Queue Register 70 also addresses the Mode Memory 110. The Mode Memory 110 is written when the netlist is loaded into the accelerator. The Mode Memory 110 contains the information as to whether the net driving device is a pulse pass, pulse suppress or pulse amplify device.

The net number from Queue Register 70 also addresses the location in the Next Value Memory 114, where the next value of the net was written on the evaluation cycle. This next value is used in lieu of the next value from the Event Queue Stage 50 for evaluation of pulse suppress and pulse amplify devices. The output of the Next Value Memory 114 (or the Queue Register 70) is loaded into a register 108, which parallels the Map Counter for timing reasons (i.e., the next value is not used at this stage of the pipe). The Next Value Memory 114 contains the value of the net which was stored when the event was placed in the Event Queue Stage 50.

THIRD STAGE

The third stage of the pipeline is the Fanout Stage 150. The Map Counter 106 of the second stage forms the address into the Fanout Memory 154. The Fanout Memory 154 contains the net numbers and input pin numbers of all devices with inputs connected to the net. This data comes from the circuit netlist. The event maturing in the Event Queue Stage 50 must be sent to all of these connected devices. The Fanout Memory 154 content is loaded into the Fanout Register 156 as the Map Counter 106 is counted once for each of the device inputs connected to the net. The Next Value is loaded into the Fanout Register 156 directly from the Index Map Stage 100 (from the New Value Register 108). No events are removed from the Event Queue Stage 50 as the Map Counter 106 is counted and the fanout devices are evaluated.

FOURTH STAGE

The fourth stage of the pipeline depicted in FIG. 2 is the Pinlist/Opcode Stage 200. The Fanout Register 156 (net number/pin number of fanout device) sources the address into the Pinlist Memory 204 and the Next Value is the data to be written in the Pinlist Memory 204 at that location. The Pinlist Memory 204 also contains the Opcode of the device to be evaluated. The Pinlist memory 204 contents are loaded into the Pinlist Register 210 with the net number from the Fanout Register 156.

FIFTH STAGE

The fifth stage of the pipeline depicted in FIG. 2 is the Evaluation Stage 250. The Pinlist Register 210 contents form an address into the evaluation memory 260. The Opcode portion of the address determines whether the truth table is for a strength evaluation device through Strength Evaluation memory 256, a gate (or state) evaluation device through Gate Evaluation memory 258, or for a memory control device.

The values of the input pins (from the Pinlist Memory 204) form the remainder of the address which in essence is the truth table look up for the particular device. The contents of the selected address is used to determine the new value for the net. The value is compared in gate 280 with the content of the Last Scheduled Value (LSV) Memory 266 to determine if an event needs to be scheduled (assuming that a schedule is not prevented or forced by schedule control). If an event is to be scheduled, the Last Scheduled Value (LSV) Memory 266 is updated. The output of the Evaluation Stage 250 is the Eval Register 290.

SIXTH STAGE

The sixth stage of the pipeline is the Event Queue Stage (write cycle). The net number and next value from the Eval Register 290 provide the input for the Event Queue Stage write cycle. The net number forms an address into the Delay Memory 78 where the prop delays of the net driving device are stored. The number of memory cycles required to store the event in the Event Queue is determined by the mode of the simulation (as controlled by UMODE). In unit delay mode, a single cycle is required to store the event since all events mature in the present or the next time interval (the Delay Memory 78 is not used). More cycles are required to store the event in timing simulation since the delays of the device determine the proper time interval in the queue and the list of events scheduled for that time slot must be accessed so that the new event may be inserted.

In unit delay mode, the simulator supports unit delay and zero delay devices. Two lists of events are maintained in memory 60. These lists are addressed by Stack Counters 56, 58. The first event list is the list of events which mature in the current time interval. The second list of events is the list of events which mature in the next time interval. As unit delay devices are evaluated, any resulting event is stored in the next time interval list memory. As zero delay devices are evaluated, any resulting event is stored in the current time interval and causes further evaluation in the current time interval. When the current time interval list is exhausted, simulation time advances to the next time interval and the lists (counters) are switched.

In timing mode, the Event Queue consists of a series of event lists. Each list corresponds to the current or some future time interval. In addition, there is a free list. When an event is stored in the Event Queue memory 60, the delay time (sourced by the Delay Memory 78) is added to the current time (CTIME) by the Event Queue Control Logic 62 to form an address to the link list pointer array in the Event Queue memory 60. The pointer array contains a pointer to the head and the tail of the linked list of events which mature in that time interval. The tail pointer is used to facilitate storing a new event. Since the pointer table address is formed by the addition of the current time to the delay time, the pointers will be correct as time advances.

Note that in both timing and unit delay mode, the net number from the Eval Register 290 forms the address to the NV Memory 114 and the LSV Memory 266. The new value for the net is written at this location in both memories. This value is read from the memories at the appropriate stages of the pipeline as previously described.

SCHEDULING

The future time interval in which the primitive output will switch to a new value (i.e., a new state/strength) is determined by the "delay mode" and the delays for the primitive. (The delay mode picks between pulse pass, pulse amplify and pulse suppress.) The delay mode and delays are stored for each unique primitive in the network before the simulation is begun. The delay mode is stored in the Mode Memory (110) shown in FIG. 2. The delays for the primitive are stored in the Delay Memory (78). The Delay Memory (78) is addressed by the Net # to access the unique group of delays which have been stored for that device. Note that two other bits are concatenated with the other Net # to pick from four delays. One of the four delays is selected based upon the next value, the current value, and the SCHD signal.

When the new value of the primitive output is different from its current value, and NSCHD is not set, an event must be scheduled to cause the output to change. When SCHD is set, an event must be scheduled to set the output to its existing value. (Although this seems strange, it is extremely valuable in pulse amplify mode when it is desired that the primitive output go undefined should another event occur while that event is scheduled.)

PULSE AMPLIFY DETAILS

Figure 3:
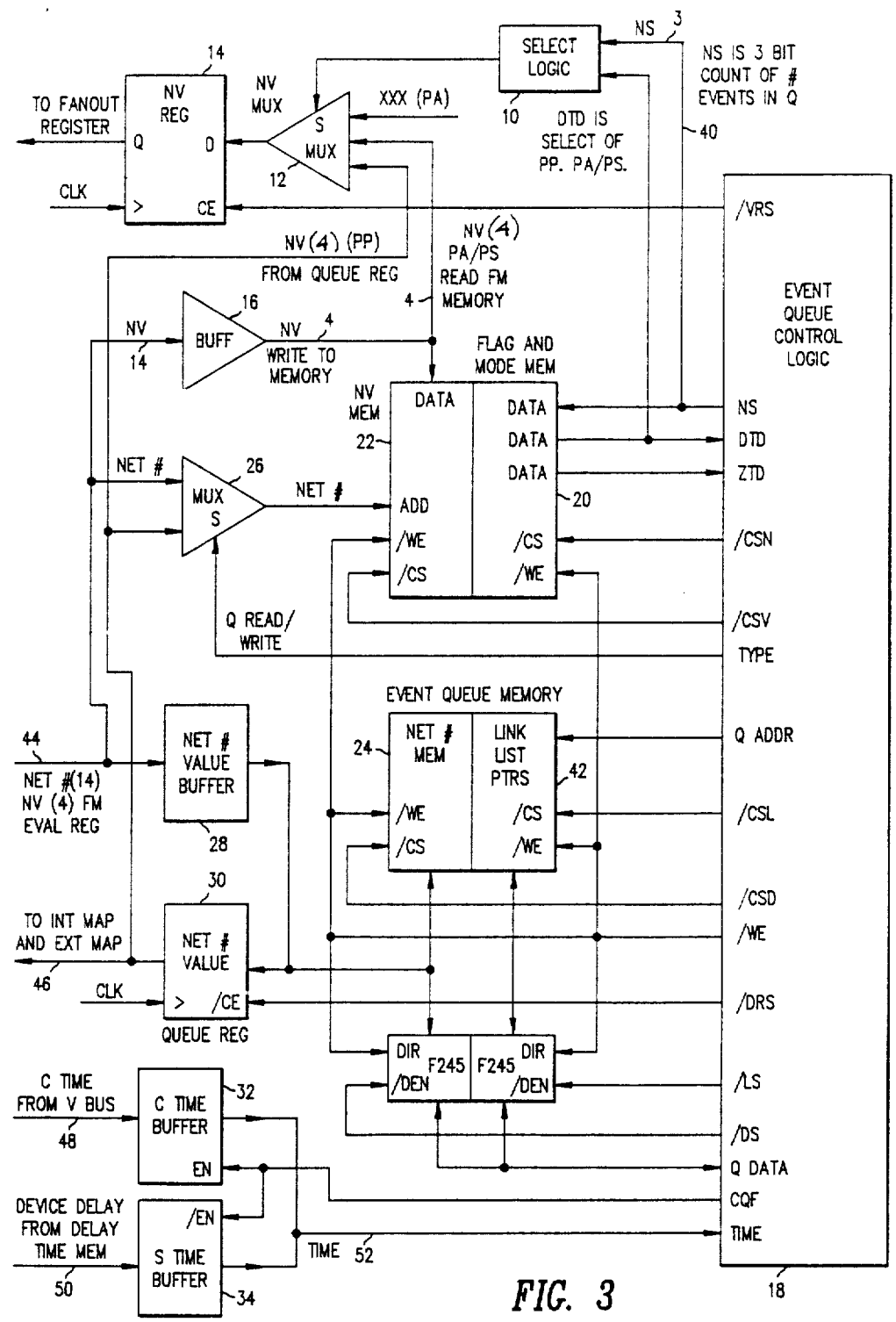
FIG. 3 depicts a diagram of a glitch detecting logic evaluator according to the present invention.

The details block diagram of the Event Queue Stage and portions of the Index Map stage is shown in FIG. 3.

The net address (unique for each net driver) affected by the maturing event is stored in the Event Queue and is used to "look up" the net activity in the subsequent stages of the pipeline.

Referencing FIG. 3, the process to store an event into the queue is:

1. The primitive delay time from the Delay Memory ((78) in FIG. 2) is added to the current time (CTIME), to determine the correct time slot in the event queue.
2. Each of the Event Queue time slots are implemented as linked lists in the Event Queue Memory (24). The control logic (18) accesses the pointer to the list from the LINK LIST PTRS array in the Event Queue Memory (24).
3. The pointer is used to address the NET # array in the Event Queue Memory (24) and the NET # is written into the NET # array. Notice that the NET # is sourced by the EVAL REG in FIG. 2 and comes into the Event Queue Memory through the NET # VALUE (28) buffer.
4. The NET # addresses the NV MEM (22) and the new value (NV) (new state/strength) for the net is written into the NV memory array.
5. The NET # is also used to address the FLAG MEM (20) so that the NS (3 bit counter) may be incremented in the memory to indicate that another event is waiting in the event queue.

The process for removing the maturing events from the queue is as follows (ref. FIG. 3):

1. The current time (CTIME) is used to find the pointer to the link list for the current time interval.
2. Each of the NET # in the linked list are read into the Queue Register (30) (shown also as (70) in FIG. 2).
3. The NET # forms the address to the NV MEM (22) and the FLAG & MODE MEM (20). The data from the NV MEM (22) feeds the NV MUX (12) and may be selected as the source for the NV REG (14).
4. The FLAG & MODE MEM (20) data feeds the Select Logic (10) for the NV MUX (12). The mode (DID) determines whether the primitive referenced by the NET # is a pulse pass, pulse suppress or pulse amplify device. The flag (NS field) determines whether there are other events in the queue for the net (primitive). If the mode is pulse amplify, and there are events in the queue, the NV REG (14) is forced to the undefined value. If the mode is pulse amplify and there are no events in the queue, the NV (PA/PS) from the NV MEM (22) is selected and loaded into the NV REG (14).

What is claimed is:

1. In a logic simulator for evaluating a plurality of simulated logic devices, a logic evaluator for detecting the input state and producing the future output state of said simulated logic devices where said input and output states may represent a logic "zero", a logic "one", and at least one state representing an "undefined" or "unknown" logic level, said logic evaluator comprising:
   means for determining the future output state of said simulated logic device based upon the present state of inputs to said device,
   means of detecting whether any future output state transitions have been scheduled to occur on said simulated logic device output;
   means for forcing said simulated logic device output to said "undefined" or "unknown" state in response to detection of future output state transitions which have been scheduled to occur on said simulated logic device output;
   wherein said forcing means forces said output state to said "undefined" or "unknown" state at any time between the scheduling of said future output state transition and the time when the last of said future output state transitions would have normally occurred, said forcing of said output state being conditioned upon the detection that future output state transitions have been scheduled to occur.

2. A logic simulator in accordance with claim 1 including:
   event queue means for storing a net number to uniquely identify the simulated logic device output having an output state transition scheduled to occur at a particular future time,
   mode memory means for storing information to control if and when said simulated logic device output state will be forced to said "undefined" or "unknown" state;
   flag memory means for counting the number of output state transitions stored in said event queue for said simulated logic device output;
   net number addressing means to allow said net number to be utilized to address said mode memory and said flag memory means; and
   selection means for determining the next output state of said simulated logic device based upon the contents of said mode memory and said flag memory.

3. A logic simulator in accordance with claim 1 including:
   means for controlling the scheduling of output state transitions independently of the present and future state of the simulated logic device output.

4. A logic simulator as in claim 3 including:
   means for selecting from a group of device delays where the selection is qualified by said schedule control means.

* * * * *